United States Patent [19]

Fricke, Jr. et al.

[11] 4,080,172
[45] Mar. 21, 1978

[54] ZONE REFINER AUTOMATIC CONTROL

[75] Inventors: Louis H. Fricke, Jr., Maplewood; Thomas E. Reichard, St. Louis, both of Mo.

[73] Assignee: Monsanto Company, St. Louis, Mo.

[21] Appl. No.: 645,186

[22] Filed: Dec. 29, 1975

[51] Int. Cl.² .............................................. B01J 17/10
[52] U.S. Cl. .............................. 23/273 SP; 156/601; 156/620; 250/577; 250/560
[58] Field of Search ................ 250/577, 560; 156/601, 156/620; 23/273 SPC, 273 Z

[56] References Cited

U.S. PATENT DOCUMENTS

| 2,992,311 | 7/1961 | Keller | 156/601 |
| 3,499,736 | 3/1970 | Zwaneburg | 156/601 |
| 3,621,213 | 11/1971 | Jen | 156/601 |
| 3,718,757 | 2/1973 | Gulitz | 156/601 |
| 3,740,563 | 6/1973 | Reichard | 250/577 |
| 3,865,554 | 2/1975 | Weufaus | 156/601 |
| 3,958,129 | 5/1976 | Clement | 250/577 |

FOREIGN PATENT DOCUMENTS

| 1,455,670 | 11/1965 | France | 23/273 Z |
| 47-47762 | 1/1972 | Japan | 23/273 Z |
| 911,515 | 11/1962 | United Kingdom | 156/620 |
| 986,293 | 3/1965 | United Kingdom | 23/273 Z |
| 986,943 | 3/1965 | United Kingdom | 23/273 Z |

Primary Examiner—Stephen J. Emery
Attorney, Agent, or Firm—Henry Croskell

[57] ABSTRACT

Disclosed is a method and apparatus for the automated growing of a floating zone refined, monocrystalline semiconductor rod. Two images of the molten/solid interface are separately positioned on two sensor arrays which, in addition to providing positioning feedback information, measure the diameter, the length of the molten zone and the "bag" or overhang angle of the molten semiconductor matter. The output of the sensor arrays are processed into signals which operate the zone refiner controls. There is thus provided an automated process for zone refining and monocrystalline rod growth of a semiconductor crystal from a seed crystal beginning with the tapering-out process, through the straight rod growth with a closely controlled diameter portion, to the end of the tapering-in process.

18 Claims, 6 Drawing Figures

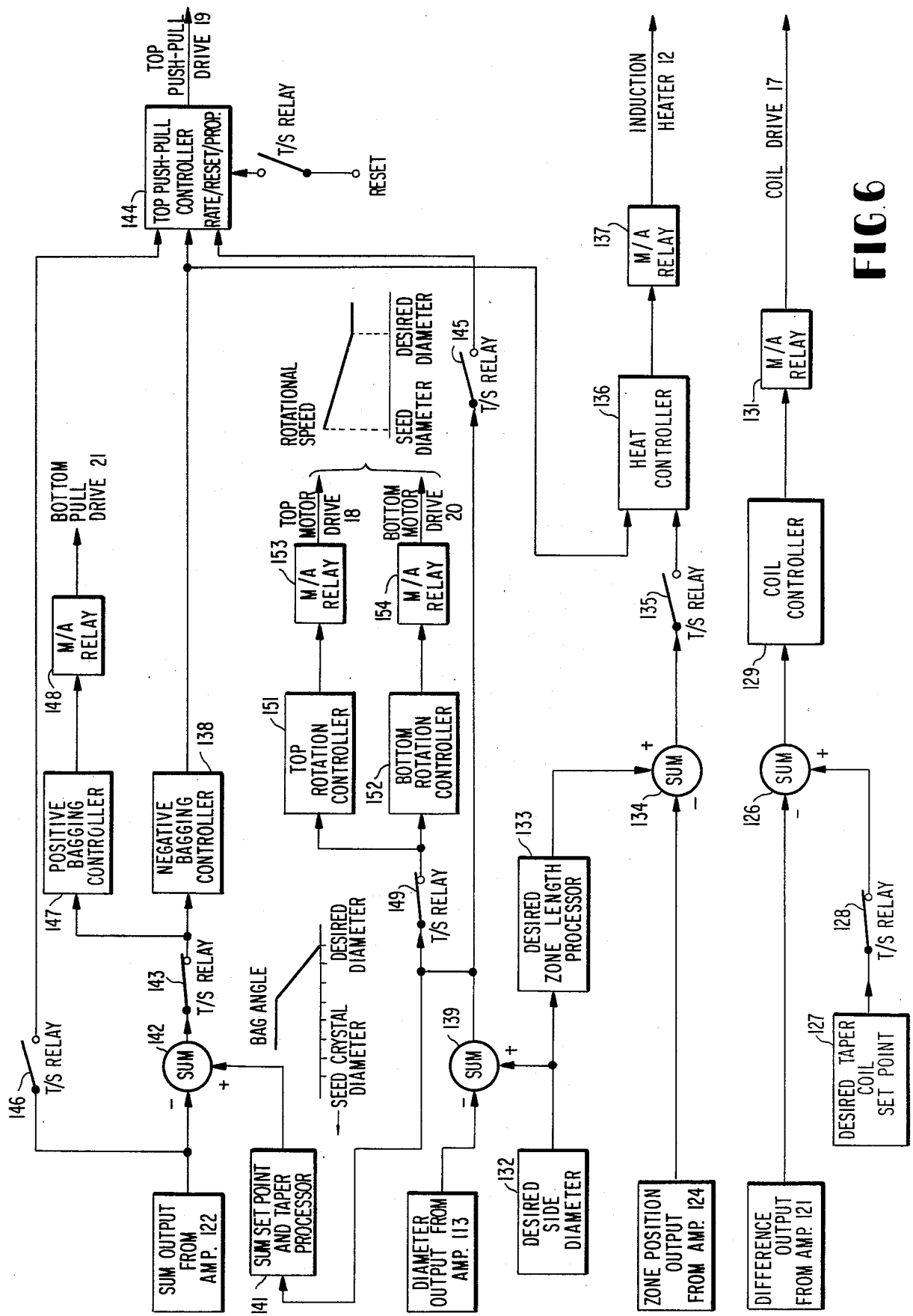

ZONE REFINER AUTOMATIC CONTROL

BACKGROUND OF THE INVENTION

This invention relates generally to zone-refining of semiconductor materials and more particularly to a method and apparatus for automated and precise control of the refining and growth of monocrystalline silicon rods.

Present manufacture of semiconductor materials requires a high degree of purity in the silicon used in making the individual components. Suitably high material purities have been achieved in a process known as zone-refining which utilizes the phenomenon where impurity concentrations in a freezing solid will always be less than the concentration in the non-frozen liquid. Consequently, if a semiconductor rod is melted completely across its cross-section and that melted zone is moved longitudinally along the rod, the melted zone will have a much higher concentration of impurities than the solid or frozen zone. Making several passes along the bar with a heating source, which melts the bar only in the immediate vicinity of the heating source, will provide a high degree of purity in the bar with the exception of the end towards which the liquid phase is moved, which will contain the majority of the impurities previously distributed throughout the bar. A prerequisite of zone refining is that the container material for the bar must not react with the semiconductor material, otherwise impurities may be added to the liquid semiconductor material. In the case of some semiconductor materials, such as silicon, which react with most known container materials, a process called floating-zone refining has been developed.

In the floating-zone refining process, a molten zone of liquid silicon is suspended by its high surface tension between two colinear vertical rods of silicon. The liquid zone is moved by the relative movement of the heating source, which normally takes the form of a radio frequency (RF) induction heating coil. Either the coil may be moved along the length of the rod or, preferably, the rod is moved through the coil. As the rod is moved down through the coil, the portion of the rod within the coil is melted, and the liquid zone then refreezes into the bottom portion of the rod as the molten portion moves upward. Normally, this process is initiated by a small diameter seed crystal on the bottom of the rod, and then the molten zone is slowly moved upward and away from this seed such that a monocrystalline structure is achieved and maintained in the refreezing bottom portion of the rod. It is advantageous to have refined rods of a larger diameter than the seed crystal where the seed crystal diameter is on the order of 5 millimeters in diameter and the finished rod is on the order of 100 millimeters in diameter. The larger diameter rods are later cut into wafers, and since they must be machined to a precise diameter, it is necessary to grow a rod only slightly larger than this diameter initially. To avoid waste of the semiconductor material, it is advantageous to grow the rod as close as possible to the desired diameter, and therefore precise diameter control is desired.

To go from the 5 millimeter to the 100 millimeter diameter requires very precise control of the melting area, such control being achieved by varying the heating rate, the relative movement between the rod portions as well as the rotational speed of the rod portions to achieve uniform heating throughout the cross-sectional area. This tapering process is extremely critical because the molten silicon must bulge or "bag" over the edge of the frozen lower rod portion so that the lower rod diameter continues to increase in an outward taper. In the past this has only been accomplished with a skilled human operator at the various controls to assure that the quantity of molten silicon is not so great as to cause a "spillover" of liquid where the molten silicon spills down the side of the newly frozen rod. The prior art indicates methods of diameter control which control the relative movement between rod portions and/or the heating rate of the induction coil based upon the freezing diameter of the straight rod only. These methods are not adaptable to controlling the growing operation during taper and are only automatic after the final rod diameter has been reached. Therefore, the tapering process is totally dependent upon the skill of the human operator from start to the end of the taper thus being subject to human error and failings. It is desirable therefore to eliminate the need for human operators and to be able to accomplish the starting and ending taper, the transistion from tapering growth to straight and back to taper, as well as maintain close tolerances on the sides of the straight portion of the crystal, completely automatically.

In the past, various methods of optically sensing and controlling the diameter of a straight crystal rod during refining have been used. See for example, Keller, U.S. Pat. No. 2,992,311. Unfortunately, none of the previous methods have provided an automated means to initiate the growth from the seed crystal diameter to the finished rod diameter and then back to a small diameter, necessitating the use of a highly skilled human operator at least during the tapering phase of the crystal growth. When existing processes were modified in an attempt to automate this growth process, it was found that using the diameter of the refrozen rod as a sensing base had too much lag time between the sensing of a change and the response signal to the zone refiner controls. Therefore, the crystals either "pull apart", breaking the continuity between the melting crystal and the freezing crystal rods, or else they "freeze out" indicating that the liquid zone freezes prematurely terminating the refining process.

SUMMARY OF THE INVENTION

Accordingly, an object of the present invention is to automate the zone refining process for semiconductor materials such that there is no need for a human operator during the tapering period.

A further object is to develop a control system that will automatically adjust the zone refining apparatus to grow both tapers and control the transition to a specified diameter for the straight section of a monocrystalline semiconductor rod.

A still further object is to develop a sensing means to control the formed diameter of the rod to within, e.g., ± 0.1 mm as it is being formed at the freezing interface.

According to the present invention, the foregoing and other objects are attained by the projection of the melting zone image upon several photo sensor arrays. A double set of sensors measures the "bag" or the amount of overhang contained in the meniscus of the melted semiconductor material as well as the diameter and zone length. The degree of overhang of the "bag" is indicative of the condition of the zone refining process (heating rate, rod feed and rotation) during taper, and utilization of this by the various control means ensures a proper "bag" which freezes to form the taper as the crystal is grown from the seed to the final rod diameter and back to the small diameter again. The pair of sensor arrays also accurately locates the liquid zone and through servo motors controlling the image projection mirrors, maintains the image of the "bag" on the sensor arrays. This method of controlling the heating element, its position relative to the rods and the relative movement between the portions by the position and shape of the "bag" allows a fully automated monocrystalline growing process for silicon and other semiconductor materials.

BRIEF DESCRIPTION OF THE DRAWINGS

FIG. 6 is an operational block diagram showing how the output signals of FIG. 5 are processed into control signals to operate the zone refiner controls of FIG. 1.

DETAILED DESCRIPTION OF THE PREFERRED EMBODIMENT

Figure 1:
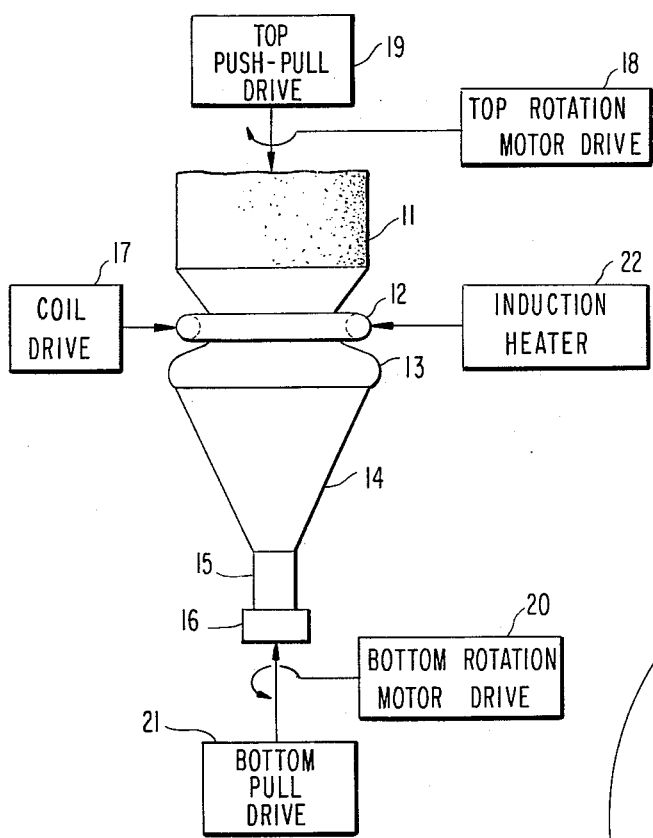
FIG. 1 is a side view of the operable portion of the zone refiner indicating the mechanical operation of the various control functions.

Referring now to the drawings wherein like reference numerals designate identical parts throughout the several views, FIG. 1 shows the operational relationship which makes up a typical zone refiner. A polycrystalline silicon rod 11 is melted by radio frequency (RF) induction heating coil 12. The molten silicon 13 gradually freezes into a monocrystalline rod 14. This monocrystalline growth is initiated by a seed crystal 15 which is supported on crystal base 16. The coil 12 is fixed in the vertical direction but is free to be controllably moved in a horizontal direction by the coil drive 17. As the polycrystalline rod 11 is melted, it is rotated by the top rotation motor drive 18 as well as pushed towards the heating coil 12 by the top push-pull drive 19. The refrozen monocrystalline rod 15 is also rotated but in the opposite direction, by the bottom rotation motor drive 20 as it is pulled away from the heater coil 12 by the bottom pull drive 21. The amount of heat generated in the silicon material by the coil 12 is controlled by the induction heating circuit 22. For clarity of understanding, the mechanical attachments of the coil drive, induction heating, bottom pull, top push-pull, top rotation and bottom rotation drives have not been shown, but are well known to those skilled in the art of zone refining.

Figure 2:
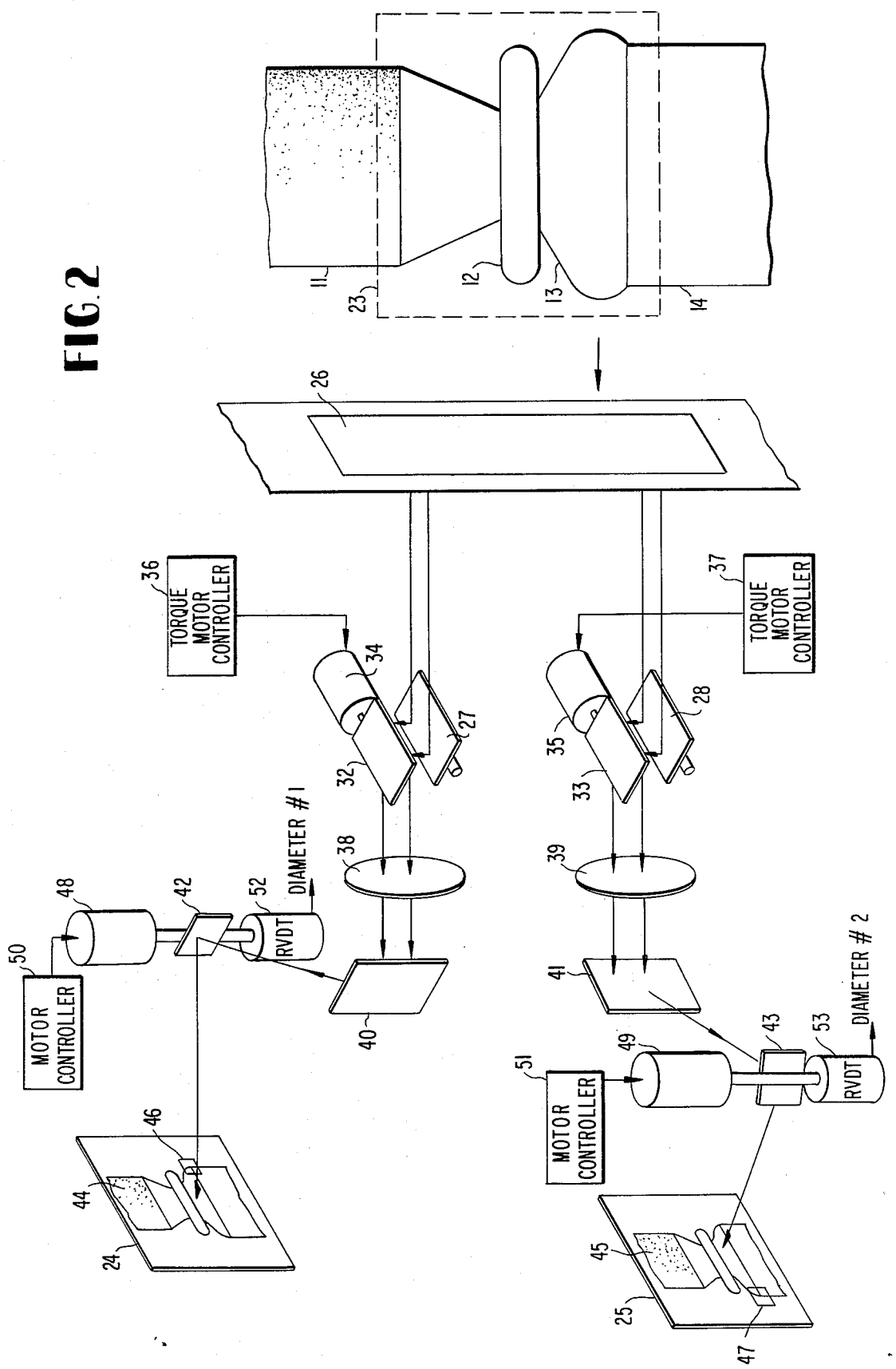
FIG. 2 is an oblique view of the operable relationship of the mechanical-optical portion of the automated zone refiner.

FIG. 2 shows the means by which the image of the refining zone 23 is transmitted to the sensor screens 24 and 25. An infrared filter 26 filters out an infrared portion of the transmitted light allowing the visible light to be reflected by fixed mirrors 27 and 28 to the vertical position mirrors 32 and 33, respectively. The images which are reflected by the mirrors 32 and 33 are positioned by torque motors 34 and 35 which are controlled by torque motor controllers 36 and 37, respectively. The images are projected through focusing lenses 38 and 39, reflected by deflection mirrors 40 and 41 and the horizontal position mirrors 42 and 43 onto sensor screens 24 and 25 and sensor arrays 46 and 47. Image positions are controlled by the angular rotation of the horizontal position mirrors 42 and 43. These are rotated by motors 48 and 49 which are controlled by motor controllers 50 and 51, respectively. An electrical output, indicative of the horizontal position of the images, is given by rotary variable differential transformers (RVDTs) 52 and 53, respectively.

Figure 3:
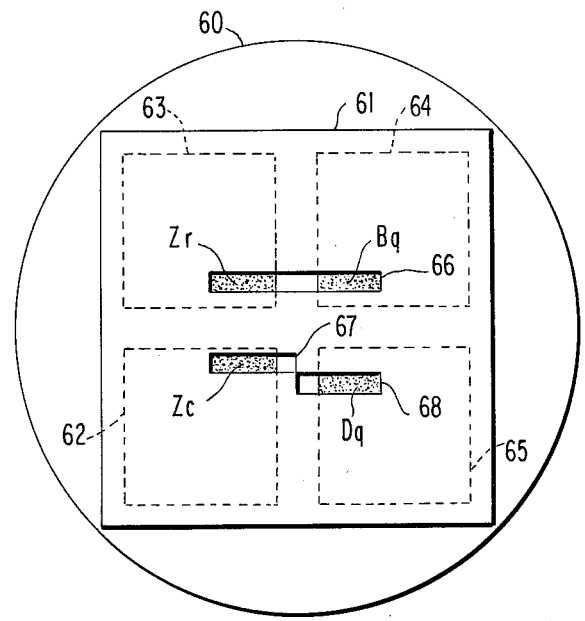
FIG. 3 is a front view of one of the masked sensor arrays used in the automated zone refiner.

FIG. 3 shows the detail of one embodiment of the sensor construction using a commercially available four element sensor array 60 which is covered by opaque mask 61. The basic sensor array 60 in this embodiment is a "pin spot/4d" photo detector commercially available from United Detector Technology, Santa Monica, Calif. The four active elements 62, 63 and 64 and 65 combine with the apertures 66, 67 and 68 to give sensor areas Zr, Bq, Zc and Dq. More specifically, aperture 66 overlaps sensors 63 and 64 to define sensor areas Zr and Bq which are horizontally aligned. Aperture 67 overlaps sensor 62 and define sensor area Zc, and aperture 68 overlaps sensor 65 to define sensor area Dq. Apertures 67 and 68, and hence sensor areas Zc and Dq, are vertically displaced with respect to one another.

Figure 4:
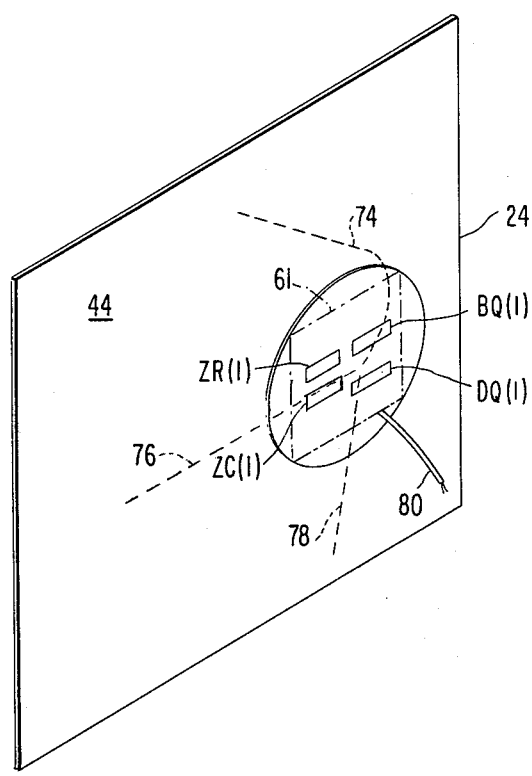
FIG. 4 is a perspective view showing the zone refiner image that is projected upon one of the masked sensor arrays.

FIG. 4 shows the location of the sensor array 46 on the screen 24 with refining zone image 44 superimposed thereon. The image is comprised of three identifiable areas. The meniscus slope shown as overhang of molten silicon or the "bag" is designated by numeral 74. Interface 76 is between the molten silicon and the frozen monocrystalline silicon rod, the edge of which is designated by numeral 78. The sensor areas Zr and Zc are used to detect the interface 76, while the sensor areas Bq and Dq are separately used to detect the "bag" 74 and the edge 78. Sensor leads 80 carry signals representing the intensity of the light striking sensor areas Zr, Zc, Bq and Dq. It will be understood by those skilled in the art that because two complete sensor arrays are utilized as indicated in FIG. 2, there will be a similar sensor on a separate and independent screen 25 located such that the opposite side of the molten silicon zone image 45 strikes the array 47 as is more clearly seen in FIG. 2. It will be further understood that the sensor located on the opposite side from the sensor shown in FIG. 4 will have a mirror image arrangement of the sensor areas indicated in FIG. 3, such that sensor area Bq remains at the "bag" edge, sensor area Dq remains on the monocrystalline rod edge, etc. Thus, the sensor areas Zr(1) and Zc(1) of sensor array 46 are used to position the image 44 on screen 24 and sensor areas Zr(2) and Zc(2) of sensor array 47 are used to position the image 45 on screen 25 by detecting the zone interface 76. An error algorithm for finding the zone interface was developed from a series of intensity plots of tapers and side diameters. The algorithm is as follows:

$$E = K_4[K_1(Zc - 0.4) + K_2(Zc - Zr) - K_3(Zc - Zr_{s.p.})]$$

where $K_1$, $K_2$, $K_3$ and $K_4$ are constants, and $Zr_{s.p.}$ is a set point value for Zr. The first term (Zc − 0.4) contributes to the error signal E for values of Zc less than 0.4 and is set to zero for all values of Zc greater than 0.4. The second term (Zc − Zr) contributes to the error signal for all values when Zr is greater than Zc. When Zr is less than Zc, the second term is set to zero. The third term (Zc − $Zr_{s.p.}$) contributes to the error signal only if both the first and second terms are zero. Otherwise, this term is set to zero. The negative sign preceding this last term is to correct the control action when the proper set point value is reached on the liquid side of the interface. The sum of these three terms is used as an error signal E to move the vertical position mirrors 32 and 33. The constants $K_1$, $K_2$ and $K_3$ have been found in practice to be approximately 3.5, 8.7 and 9.3, respectively.

Figure 5:
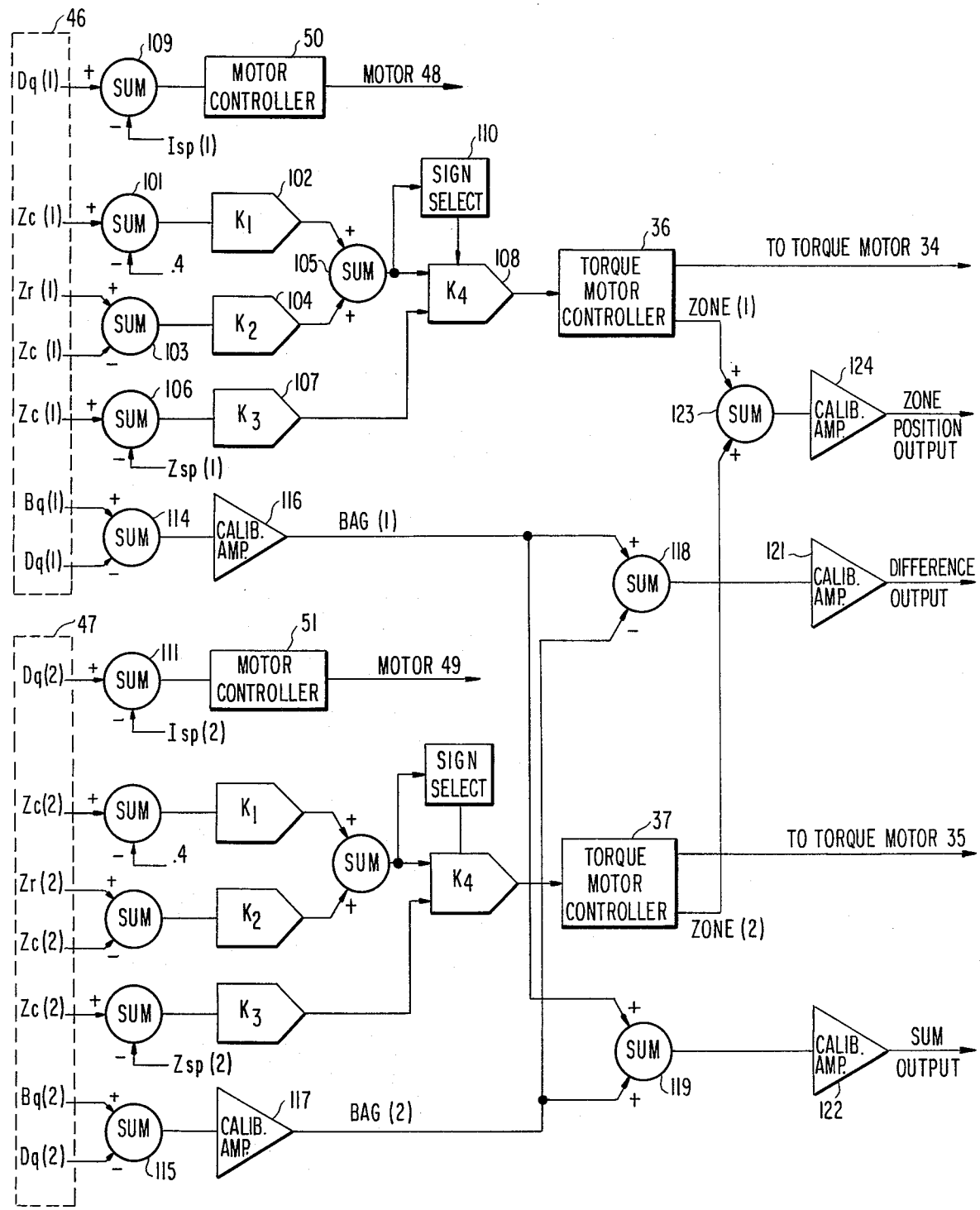
FIG. 5 is a block diagram showing the initial processing of the signals from the photo-sensor arrays.

Referring to FIG. 5, the zone interface algorithm is implemented in one embodiment by analog computing circuits. While the algorithm is implemented for both of sensor arrays 46 and 47, a description will be provided with respect to array 46 only, it being understood that the same description also applies to array 47. The first term of the error algorithm is computed by summing amplifier 101 and multiplier 102. More specifically, the signal generated by the sensor area Zc(1) is supplied to the positive input of the summing amplifier 101 while the value .4 is supplied to the negative input of the summing amplifier 101. The output of summing amplifier 101 is supplied to multiplier 102 which multiplies this signal by the constant $K_1$. In a similar manner, the second term of the error algorithm is computed by summing amplifier 103 and multiplier 104. The outputs of multipliers 102 and 104 are summed by summing amplifier 105. The third term is computed by summing amplifier 105 and multiplier 107. The error signal E which is supplied to torque motor controller 36 is generated by multiplier 108 which combines the outputs of summing amplifier 105 and multiplier 107 and multiplies this combined signal by a constant $K_4$. A sign elect circuit 110 controls the polarity of the output of multiplier 108. The reason for this is that there is a peak in luminosity versus vertical position at the interface 76, and the sign select determines which side of the peak the sensor is detecting. In a similar manner, an error signal E' is generated and supplied to torque motor controller 37. The result of these computations is to generate control signals for each of motors 34 and 35, respectively, to accurately position the images 44 and 45 in the vertical direction on screens 24 and 25, respectively. That is, the images are positioned so that the interface image 76 is positioned between sensor areas Zc and Zr of the sensor arrays 46 and 47.

In addition to vertically positioning the images, it is also necessary to horizontally position the images and, in so doing, to measure the diameter of the rod. The diameter measurement is, of course, critical to the tapering-out and tapering-in control as well as maintaining an accurate diameter of the rod throughout its principal length. Signals developed by the sensor areas Dq(1) and Dq(2) of sensor arrays 46 and 47 are supplied to the positive inputs of summing amplifiers 109 and 111, respectively. Amplifiers 109 and 111 also receive set point signals at their negative inputs and provide outputs to the motor controllers 50 and 51, respectively. As a result, control signals are supplied to motors 48 and 49 to cause the rotation of mirrors 42 and 43, respectively. This results in the horizontal positioning of the images on screens 24 and 25. RVDT 52, on a common shaft with motor 48, and RVDT 53, on a common shaft with motor 49, provide output signals corresponding to the angular displacements of mirrors 42 and 43, respectively. These signals are supplied to summing amplifier 112, the output of which is provided to a calibration amplifier 113 to generate a signal proportional to rod diameter.

Finally, "bagging" (i.e., is measured on both sides of the rod by using the signals generated by sensor areas Dq and Bq. More specifically, the signals from sensor areas Dq(1) and B1(1) are supplied to summing amplifier 114, while the signals from sensor areas Dq(2) and Bq(2) are supplied to summing amplifier 115. The outputs of summing amplifiers 114 and 115 are supplied via calibration amplifiers 116 and 117 to summing amplifiers 118 and 119. Summing amplifier 118 computes the difference of the "bag" signals, and this difference as supplied by calibration amplifier 121, is used to produce a centering signal for the heater coil as will be explained in more detail with respect to FIG. 6. Summing amplifier 119 computes the sum of the "bag" signals to provide a more accurate measure of the total "bagging" at the output of calibration amplifier 122.

One additional signal is generated by the analog circuitry of FIG. 5. This is the zone position signal which is computed by summing amplifier 123 and calibration amplifier 124. This computation is performed on signals supplied to summing amplifier 123 by torque motor controllers 36 and 37.

The outputs of each of the calibration amplifiers 113, and 121, 122, and 124 are supplied to the analog and control circuitry illustrated in FIG. 6 to generate the control signals for the several controls shown in FIG. 1. By reference to FIG. 1, the functional relationship of various control systems can be understood. If the heating rate of the induction heater 12 is too high, more molten silicon 13 will accumulate than can be retained, even with its relatively high surface tension, resulting in "spill over" of molten silicon over the edge of the frozen monocrystalline rod 14. The same result will be attained if the top pushpull drive 19 pushes the polycrystalline rod 11 towards the heater coil 12 at too high a rate or if the bottom pull drive 21 pulls the monocrystalline rod 14 downward at too slow a rate. Both rod portions 11 and 14 are rotated in the opposite directions by motor drives 18 and 20 to obtain a higher degree of mixing improving the efficiency of the zone refining process. This additionally provides a degree of symmetry in the refreezing portion of the rod. The coil drive 17 positions the induction heating coil 12 such that it remains centered on the axis of the refreezing monocrystalline rod 14 after the taper reaches a size which allows sufficient induction heat coupling as will be discussed further hereinafter.

Initially, the seed crystal 15 is bonded to the crystal base 16 and raised to a point just below the plane of the heater coil 12. Because silicon is a very poor conductor at room temperatures when in a highly refined state, an external heating device (not shown), is used to bring the polycrystalline rod up to the temperature at which the induction heating coil 12 can sufficiently couple electromagnetically and melt the polycrystalline rod 11. When the polycrystalline rod begins to melt a droplet is formed on the end which extends downward through the coil. The seed crystal 15 is then raised to contact the droplet. Because of the small size of the seed crystal, the coil is moved off-center to allow a higher RF coupling between the seed and the coil. When the top of the seed melts, the seed is drawn down and away from the coil as the polycrystalline rod is pushed toward the coil. The molten silicon will form an "hourglass" shape between the polycrystalline rod and the seed crystal. If there is sufficient molten material suspended, it will bulge or "bag" over the edge of the seed crystal. As the seed crystal moves away from the heater coil, the portion of the "bag" adjacent to the top of the seed crystal will freeze with a monocrystalline orientation. If the "bag" is maintained, the diameter of the frozen portion will increase. Since the object is to attain the desired rod diameter as quickly as possible, the sharpest possible increase in diameter is desired and thus a large amount of molten "bag" is required. This "bag" must be kept right on the edge of a "spillover" without actually allowing molten silicon to flow down the side of the seed crystal.

The control of the "bag" is the critical factor in growing the rod from the 5 mm diameter seed crystal to the 80 mm or larger diameter monocrystalline rod. Of course once the rod reaches its desired diameter, it is then necessary to bring about a transition to a straight solid rod while accurately maintaining the diameter as the float zone refining continues up the length of the rod. At the top of the rod, it is desired to taper back down to as small a diameter as possible because even after the heater is turned off and the molten section "freezes out", the removal of the top portion of the crystal causes a dislocation shock that is transmitted approximately one diameter down the rod. If the 80 mm diameter was maintained, the top 80 mm would be useless for silicon wafers because the transmitted dislocations would adversely affect the wafers' electrical properties. Therefore, it is desirable to reduce the diameter as much as possible so that only a minimum amount of rod is lost.

The foregoing functions are accomplished with the analog and control circuitry shown in FIG. 6. The output of amplifier 121 is applied to a summing amplifier 126 and subtracted from a desired taper coil set point supplied by a function generator 127. This set point is connected to the amplifier 126 only during the taper process through contacts 128 of the taper/straight (T/S) relay and is set at 0 during the non-taper, straight portion of the refining process. The T/S relay is shown in the taper position. The difference between the desired taper coil set point and the output of amplifier 121 is then sent to the coil controller 129 which operates the coil positioning through the manual/automatic (M/A) relay 131. This set point allows the coil to be offset at the beginning of the taper to provide an increased RF coupling with the small seed crystal. After the growth starts, the set point signal gradually decreases until the coil is centered. This coil positioning also permits zone refining of silicon rods which are slightly bowed or "doglegged". After the taper operation is terminated, the set point goes to zero allowing the output of amplifier 121 to position the coil 12 through coil drive 17 to ensure uniformity. During manual operation, the coil drive 17 is adjusted through manual actuation of the controls, and it is only during automatic operation that the coil controller 129 controls the coil position. The coil moves in and out along a radius of the finished rod which is perpendicular to the axis of the rod and in the plane of the two sensor arrays. This then centers the monocrystalline rod 14 as it is grown.

The desired straight rod diameter is set in at 132 as a set point which is supplied to a desired zone length processor 133 to give an output according to the following equation:

$$\text{zone length (z1)} = k_1 d - k_0,$$

wherein $k_1$ and $k_0$ are constants and $d$ is the desired diameter. The output of processor 133 is supplied to the positive input of summing amplifier 134 which receives as its negative input, the output of amplifier 124. The output of summing amplifier 134 is a zone error signal. This signal is transmitted via contacts 135 of the T/S relay only during the straight side operation to the heat controller 136 which is then fed through the manual/automatic (M/A) relay 137 to the induction heating coil 12. Thus, if the zone position or the interface 76 between the molten silicon and the frozen monocrystalline rod 14 tends to move above the sensors, the zone position output would tend to create a larger zone error increasing the amount of heat applied to the induction coil thereby increasing the amount of molten material and causing the freezing interface to move down, further away from the coil.

During taper operations, the heat controller 136 is not controlled by the zone error signal but by the negative bagging controller 138 which is a function of the amplifier 122 output. The output of amplifier 122 provides a measure of the slope of the freezing interface, in other words, how much the "bag" overhangs the freezing rod. The diameter output from amplifier 113 is subtracted from the desired side diameter in a summing amplifier 139, and the resultant diameter error signal is transmitted to the "bag" set point and taper processor 141. The processor 141 provides a gradually decreasing signal i.e., a meniscus slope reference signal as the desired diameter is approached to promote an even transition to the straight side crystal growth. The output of amplifier 122 is subtracted from the output of processor 141 by summing amplifier 142, and the resulting difference signal is supplied to the negative bagging controller 138 through contacts 143 of the T/S relay.

During taper operations, the output of negative bagging controller 138 is also supplied to top push-pull controller 144. However, during non-taper operations, the output of summing amplifier 139 is supplied as one input to controller 144 through contacts 145 of the T/S relay. The other input to controller 144 during non-taper operations is the output of amplifier 122 through relay contacts 146 of the T/S relay. Therefore, if the diameter of the rod is getting too large or the bag signal is getting to great, the controller 144 would tend to slow down the amount of top push on the polycrystalline rod 11 and thus its rate of melting would tend to decrease. This then decreases the amount of molten material and decreases the "bag" associated with that molten zone. This also tends to decrease the diameter at the freezing interface until the diameter error signal is against 0.

The output of amplifier 142 is transmitted through contacts 143 of the T/S relay during taper operations to the positive bagging controller 147 as well as the negative bagging controller 138. If the signal is of a positive polarity, the positive bagging controller 147 will actuate the bottom pull drive 21 through the manual/automatic (M/A) relay 148 until there is an insufficient positive signal, while providing no control output if there is a negative polarity signal. Similarly, the negative bagging controller 138 will produce an output to both the top push-pull controller 144 and the heat controller 136 if there is a negative polarity signal but has no output for a positive polarity signal. This, then, insures that the heat applied to the induction coil 12 through heat controller 136 and the amount of top push is sufficient to maintain the proper bag during the taper operations.

The diameter error signal from amplifier 139 is supplied through contacts 149 of the T/S relay during the taper operations to the top rotation controller 151 and the bottom rotation controller 152, through the separate manual/automatic relays 153 and 154, respectively, which decreases the rotational speed as a function of the increasing diameter such that the centrifugal force acting upon the "bag" remains the same when the radius of the monocrystalline rod 14 increases during the taper operations.

It will be understood that tapering-in operation can be initiated by a suitable time or distance input when a predetermined length of rod has been zone refined (e.g., by operating a microswitch when a suitable length has been traversed) by providing a reduced diameter signal at 132. For example, a different diameter set point is switched in and summed at 139. An operator can also be signalled, as by a bell, when tapering-in begins.

During straight side control, reset action is switched in, in addition to the proportional control, to eliminate any long term accumulated errors of the diameter error signal.

Thus, it can be seen that the entire zone refining operation is completely automated with the exception of setting the initial parameters, such as the desired tapering angle and the finished rod diameter before initiation of operation. In this manner, the sizes of refined monocrystalline silicon rods can be very closely controlled while reducing or eliminating wasted material. Numerous variations upon the basic circuitry required for this operation can be made by those skilled in the art, but the principle of sensing the "bag" shape and using the shape to electromechanically control the zone refiner operation allows the elimination of the human operator which was required by all previous zone refiners, at least during the taper process. Obviously, numerous modifications and variations of the invention are possible in the light of the above teachings. It is therefore to be understood that within the scope of the appended claims the invention may be practiced otherwise than as specifically described therein.

What is claimed is:

1. In an automatic floating zone refiner for zone refining of semiconductor rods having a substantially constant diameter length and opposite ends precisely tapered to a smaller diameter, said refiner including a seed rod holder and a feed rod end holder vertically spaced from each other and, thus, defining a vertical processing axis, said seed crystal holder being adapted to mount a monocrystalline seed crystal, said feed rod holder being adapted to mount a polycrystalline feed rod of semiconductor material to be refined as monocrystalline material seeded by said crystal, said holders being relatively movable with respect to each other along said axis, an RF induction heating coil; an RF source means for energizing said coil for melting said feed rod to form a molten refining zone having an interface between a molten portion of said feed rod and a refreezing monocrystalline refined rod extending from said seed crystal, said molten portion having a meniscus slope adjacent to and above said interface, said refreezing rod having a side edge adjacent to and below said interface; said RF source means being controllable for varying the heating rate of said coil; feed rod rotation means for controllably rotating said feed rod; feed rod positioning means for controllably varying the position of said feed rod with respect to said coil; seed crystal rotation means for controllably rotating said seed crystal in a direction opposite to said feed rod; and seed crystal positioning means for controllably varying the position of said seed crystal with respect to said coil; said refiner being adapted for being operated in an initial tapering out mode for tapering out the diameter of said refreezing rod for an initial portion of its length, then in a straight refining made for substantially constant diameter refining of said refreezing rod for a principal portion of its length, and subsequently in a tapering in mode for a terminal portion of its length; the improvement comprising:

a. image sensing means including at least one light-sensing array, means for projecting an image of said refining zone on said array, edge sensing means for sensing the image of said refreezing rod side edge; and slope sensing means for sensing the image of said meniscus slope; said interface sensing means comprised of at least first and second sensors of said array, said first sensor being illuminated by an image of the molten portion of said refining zone and said second sensor being illuminated by an image of a portion of said refreezing monocrystalline rod adjacent said interface, said first and second sensors producing outputs $Z_r$ and $Z_c$, respectively, and said interface sensing means further comprising:

first, summing means for comparing said $Z_c$ output of the sensing means with a preset value and producing no output if the output is less than said value but producing an output signal proportional to the difference between the two if the $Z_c$ output is greater than said preset value;

second, summing means for comparing said $Z_c$ and $Z_r$ outputs and producing an output proportional to the difference thereof only if $Z_r$ is greater than $Z_c$ but producing no output otherwise;

third, summing means for comparing said $Z_c$ output with a second preset value and producing an output proportional to the difference thereof only if no outputs are produced by said first and second summing means;

first multiplier means for multiplying the output of said first summing means by a constant $K_1$;

second multiplier means for multiplying the output of said second summing means by a constant $K_2$;

third multiplier means for multiplying the output of said third summing means by a constant $K_3$;

combination summing and multiplying means for combining as a sum outputs of said first, second and third multiplier means and multiplying said sum by a constant $K_4$ and whose output is represented by the following equation:

$$\text{Output} = K_4[K_1(K_1(Z_c - \text{preset value}) + K_2(Z_c - Z_r) + K_3(Z_c - \text{preset value})],$$

said output being a function of the difference in position between said interface image and the junction between said first and second sensors;

b. means for controlling the position of said refining zone image relative to said array, comprising:

means, responsible to said interface sensing means, for vertically positioning said zone image with respect to said array; and means, responsive to said edge sensing means, for horizontally positioning said zone image with respect to said array;

c. diameter set point means for providing a desired diameter reference signal representing the desired diameter of refined rod during said straight refining mode;

d. diameter control circuit means, responsive to said diameter reference signal and said edge sensing means and operative only during said straight refining mode, for controlling said feed rod positioning means in a sense tending to maintain refined rod diameter substantially constant at said desired diameter;

e. taper processor circuit means, responsive to said diameter reference signal, for providing a meniscus slope reference signal representing a proper meniscus slope for causing the diameter of said refreezing rod to increase to or decrease from said desired diameter for producing a taper of said refreezing rod;

f. taper control circuit means, responsive to said meniscus slope reference signal and said slope sensing means and operative only during a taper refining mode, for controlling at least one of said feed rod positioning means, said seed crystal positioning means, and said RF source in a sense tending to produce a configuration of said molten zone for initially tapering out the diameter of said refreezing rod, and after straight refining thereof, for subsequent tapering in the diameter of said refreezing rod; of said tapering in mode.

2. The apparatus of claim 1 further comprising:

zone length processor circuit means, responsive to said diameter reference signal, for providing a zone length reference signal representing a proper length of said molten zone; and zone length control circuit means, responsive to said zone length reference signal and said interface sensing means and operative only during said straight refining mode, for causing said RF source to vary the heating rate of said coil in a sensing tending to maintain said proper length of said molten zone.

3. The apparatus of claim 2 wherein said zone length processor means gives an output according to the following equation:

zone length (z1) = $k_1 d - k_o$ wherein $K_1$ and $k_o$ are constants and $d$ is said desired diameter.

4. The apparatus of claim 1 wherein said means for controlling the position of said refining zone image relative to said array comprises vertical and horizontal deflection mirrors positioned by vertical and horizontal motors controlled by vertical and horizontal controllers, respectively, wherein said controllers generate motor control signals to operate said vertical and horizontal motors in response to the error signals from said position controlling means, said vertical and horizontal motors changing the respective vertical and horizontal angles of said deflection mirrors to correctly position said refining zone image on said array.

5. The apparatus of claim 1 wherein said light sensing array includes a multiple element photo diode with a mask superposed thereon, said mask having apertures therein which define in combination with said photo diode a multiple sensor photo diode array upon which said refining zone image is projected, said apertures being positioned to provide sensing only of predetermined areas of said refining zone image.

6. The apparatus of claim 1 wherein said means for vertically positioning said zone image comprises:

a vertical image deflection mirror; and torque motor means responsive to the output of said combination summing amplifier and multiplying means for varying the deflection angle of said verticle image deflection mirror to maintain the said image of said interface in a predetermined position relative to said first and second sensors.

7. The apparatus of claim 6 wherein said means for horizontally positioning said zone image comprises:

a horizontal image deflection mirror; and torque motor means responsive to said output $D_1$ for varying the deflection angle of said horizontal image deflection mirror to maintain the image of said edge relative to said sensor.

8. The apparatus of claim 6 further comprising means, responsive to said output $D_q$ during said tapering out and tapering in modes, for controlling said feed rod rotation means and said seed crystal rotation means in a sense tending to increase the rotation rates of said feed rod and seed crystal when there is a reduced diameter of said refreezing rod resulting from tapering.

9. The apparatus of claim 1 wherein said edge sensing means comprises a sensor of said array which is illuminated by the image of an edge of said refreezing monocrystalline rod adjacent said interface, said sensor producing an output $D_q$ which is a measure of the diameter of said refreezing monocrystalline rod.

10. The apparatus of claim 1 wherein said slope sensing means comprises a sensor of said array which is illuminated by the image of said meniscus, said sensor producing an output $B_q$ which is proportional to said slope.

11. The apparatus of claim 10 wherein said taper control circuit is responsive to $B_q$ output and said meniscus slope reference signal during said tapering out and tapering in modes.

12. The apparatus of claim 10 wherein said heating coil is controllably movable in a radial direction with respect to said vertical processing axis, and wherein said slope sensing means comprises plural array sensors illuminated by images of opposite sides of said meniscus, said plural sensors providing respective outputs $B_q(1)$ and $B_q(2)$ which are proportional to the respective slope on opposite sides of said meniscus, the further improvement comprising:

means for comparing the difference between said outputs $B_q(1)$ and $B_q(2)$; and coil position controller means for moving said coil in said radial direction as a function of said difference.

13. The apparatus of claim 12 further comprising means, operative initially during said tapering out mode, for causing said coil to move in a radial direction which is off-center with respect to said vertical processing axis, thereby to allow higher RF coupling between said coil and said seed crystal, said coil position controlling means otherwise tending to center said coil for minimizing said difference between said outputs $B_q(1)$ and $B_q(2)$.

14. The apparatus of claim 11 wherein said taper control circuit comprises:

first bagging control means, responsive to change of said output $B_q$ with respect to said meniscus slope reference signal representing excessive bagging of said molten zone, for causing said seed crystal positioning means to pull said seed crystal in a direction away from said coil; and second bagging control means, responsive to change of said output $B_q$ with respect to said meniscus slope reference signal representing insufficient bagging of said molten zone, for causing said feed rod positioning means to push said feed rod in a direction toward said coil.

15. The apparatus of claim 14 wherein said second bagging control means is also operative, in response to change of said output $B_q$ with respect to said meniscus slope reference signal representing insufficient bagging of said molten zone, to cause said RF source means to increase the heating rate of said coil.

16. The apparatus of claim 11 further comprising means operative during said straight refining mode, for permitting increase of said output $B_q$ to cause said feed rod positioning means to retard pushing of said feed rod in a direction toward said coil.

17. In a floating zone refiner for zone refining of semiconductor rods having a substantially constant diameter length and opposite ends precisely tapered to a smaller diameter, said refiner including a seed rod holder and a feed rod end holder vertically spaced from each other and, thus, defining vertical processing axis, said seed crystal holder being adapted to mount a monocrystalline seed crystal, said feed rod holder being adapted to mount a polycrystalline feed rod of semiconductor material to be refined as monocrystalline material seeded by said crystal, said holders being relatively movable with respect to each other along said axis, an RF induction heating coil; and RF source means for energizing said coil for melting said feed rod to form a molten refining zone having an interface between a molten portion of said feed rod and a refreezing monocrystalline refined rod extending from said seed crystal, said molten portion having a meniscus slope adjacent to and above said interface, said refreezing rod having a side edge adjacent to and below said interface; said refiner being adapted for being operated in an initial tapering out mode for tapering out the diameter of said refreezing rod for an initial portion of its length, then in a straight refining made for substantially constant diameter refining of said refreezing rod for a principal portion of its length, and subsequently in a tapering in mode for a terminal portion of its length; the improvement comprising image sensing means including a light-sensing array, and means for projecting an image of said refining zone on said array, said image sensing means comprising:

a. interface sensing means for sensing the image of said interface comprising first and second light-sensing areas of said array, said first area for being illuminated by an image of the molten portion of said refining zone and said second area for being illuminated by an image of a portion of said refreezing monocrystalline rod adjacent said interface, said first and second areas being adapted for producing output signals adapted to be processed to provide a processed output which is a function of the position of said interface image with respect to said first and second areas, said first and second light sensing areas produce outputs $Z_r$ and $Z_c$, respectively, and said interface sensing means further including processing circuitry comprising:

first summing means for comparing and $Z_c$ output of the sensing means with a preset value and producing no output if the output is less than said value but producing an output signal proportional to the difference between the two if the $Z_c$ output is greater than said preset value;

second summing means for comparing said $Z_c$ and $Z_r$ outputs and producing an output proportional to the difference thereof only if said $Z_r$ output is greater than said $Z_c$ output but producing no output otherwise;

third summing means for comparing said $Z_c$ output with a second preset value and producing an output proportional to the difference thereof only if no outputs are produced by said first and second summing means;

first multiplier means for multiplying the output of said first summing means by a constant $K_1$;

second multiplier means for multiplying the output of said second summing means by a constant $K_2$;

third multiplier means for multiplying the output of said third summing means by a constant $K_3$;

combination summing and multiplying means for combining as a sum outputs of said first, second and third multiplier means and multiplying said sum by a constant $K_4$ and whose output is represented by the following equation:

$$\text{Output} = K_4[K_1(Z_c - \text{preset value}) + K_2(Z_c - Z_r) + K_3(Z_c - \text{preset value})],$$

said output being a function of the difference in position between said interface image and the junction between said first and second light sensing areas;

b. edge sensing means for sensing the image of said refreezing rod side edge comprising a third light sensing area of said array for being illuminated by an image of an edge of said refreezing monocrystalline rod adjacent said interface and adapted for producing an output signal which is a measure of the diameter of said refreezing monocrystalline rod; and c. meniscus slope sensing means for sensing the image of said meniscus slope comprising a fourth light sensing area of said array for being illuminated by the image of said meniscus and adapted for producing an output signal which is proportional to said slope.

18. The apparatus of claim 17 wherein said light sensing array comprises a multiple element photo diode with a mask superposed thereon, said mask having apertures therein which define in combination with said photo diode said first, second, third and fourth light sensing areas.

* * * * *